United States Patent
Bornert et al.

(10) Patent No.: US 10,816,625 B2
(45) Date of Patent: Oct. 27, 2020

(54) SILENT 3D MAGNETIC RESONANCE FINGERPRINTING

(71) Applicant: KONINKLIJKE PHILIPS N.V., Eindhoven (NL)

(72) Inventors: Peter Bornert, Hamburg (DE); Kay Nehrke, Ammersbek (DE); Mariya Ivanova Doneva, Hamburg (DE); Thomas Erik Amthor, Hamburg (DE); Peter Koken, Hamburg (DE); George Randall Duensing, Gainsville, FL (US)

(73) Assignee: Koninklijke Philips N.V., Eindhoven (NL)

( * ) Notice: Subject to any disclaimer, the term of this patent is extended or adjusted under 35 U.S.C. 154(b) by 182 days.

(21) Appl. No.: 16/095,954

(22) PCT Filed: Apr. 26, 2017

(86) PCT No.: PCT/EP2017/059876
§ 371 (c)(1),
(2) Date: Oct. 24, 2018

(87) PCT Pub. No.: WO2017/186768
PCT Pub. Date: Nov. 2, 2017

(65) Prior Publication Data
US 2019/0137585 A1    May 9, 2019

Related U.S. Application Data
(60) Provisional application No. 62/327,647, filed on Apr. 26, 2016.

(30) Foreign Application Priority Data
Jun. 2, 2016   (EP) .................................. 16172560

(51) Int. Cl.
*G01R 33/50* (2006.01)
*G01R 33/48* (2006.01)
(Continued)

(52) U.S. Cl.
CPC ....... *G01R 33/4816* (2013.01); *G01R 33/485* (2013.01); *G01R 33/50* (2013.01);
(Continued)

(58) Field of Classification Search
CPC .. G01R 33/4816; G01R 33/485; G01R 33/50; G01R 33/5602; G01R 33/5608;
(Continued)

(56) References Cited

U.S. PATENT DOCUMENTS 9,348,007 B2 * 5/2016 Son .................. G01R 33/48
9,541,624 B2 * 1/2017 Fu ................... G01R 33/5607
(Continued)

OTHER PUBLICATIONS

Ma et al "Magnetic Resonance Fingerprinting" Nature, Vol. 495, pp. 187-193.
(Continued)

*Primary Examiner* — Jermele M Hollington
*Assistant Examiner* — Taqi R Nasir (57) ABSTRACT

The invention provides for a magnetic resonance imaging system (100) for acquiring magnetic resonance data (142) from a subject (118) within an imaging zone (108). The magnetic resonance imaging system comprises a memory (134, 136) for storing machine executable instructions (160), and pulse sequence commands (140, 400, 502, 600, 700), wherein the pulse sequence commands are configured to cause the magnetic imaging resonance system to acquire the magnetic resonance data according to a magnetic resonance fingerprinting technique. The pulse sequence commands are further configured to control the magnetic resonance imaging system to perform spatial encoding using a zero echo
(Continued)

time magnetic resonance imaging protocol. Execution of the machine executable instructions causes the processor controlling the MRI system to: acquire (200) the magnetic resonance data by controlling the magnetic resonance imaging system with the pulse sequence commands; and calculate (202) a spatial distribution (146) of each of a set of predetermined substances by comparing the magnetic resonance data with a magnetic resonance fingerprinting dictionary (144).

14 Claims, 3 Drawing Sheets

(51) Int. Cl.
    *G01R 33/56* (2006.01)
    *G01R 33/561* (2006.01)
    *G01R 33/563* (2006.01)
    *G01R 33/485* (2006.01)

(52) U.S. Cl.
    CPC ....... *G01R 33/561* (2013.01); *G01R 33/5602* (2013.01); *G01R 33/5608* (2013.01); *G01R 33/56308* (2013.01); *G01R 33/56341* (2013.01); *G01R 33/4824* (2013.01); *G01R 33/4826* (2013.01); *G01R 33/5605* (2013.01)

(58) Field of Classification Search
    CPC ............ G01R 33/561; G01R 33/56308; G01R 33/56341; G01R 33/4824; G01R 33/4826; G01R 33/5605
    See application file for complete search history.

(56) References Cited

U.S. PATENT DOCUMENTS

| | | | |
|---|---|---|---|
| 9,557,396 B2* | 1/2017 | Balu | G01R 33/50 |
| 9,874,623 B2* | 1/2018 | Fielden | G01R 33/5608 |
| 2013/0265047 A1 | 10/2013 | Griswold et al. | |
| 2013/0271132 A1 | 10/2013 | Griswold | |
| 2015/0070012 A1 | 3/2015 | Griswold et al. | |
| 2015/0115956 A1 | 4/2015 | Ackerman et al. | |
| 2015/0131884 A1* | 5/2015 | Kimura | A61B 5/0263 382/131 |
| 2015/0301141 A1* | 10/2015 | Griswold | G01R 33/5608 382/131 |
| 2015/0302842 A1 | 10/2015 | Griswold et al. | |
| 2015/0346300 A1* | 12/2015 | Setsompop | G01R 33/4828 324/309 |

OTHER PUBLICATIONS

Weigel, M. (2015), Extended phase graphs: Dephasing, RF pulses, and echoes—pure and simple. J. Magn. Reson. Imaging, 41: 266-295. doi: 10.1002/jmri.24619.

Scheffler, K. (1999), A pictorial description of steady-states in rapid magnetic resonance imaging. Concepts Magn. Reson., 11: 291-304. doi: (1999)11:5<291::AID-CMR2>3.0.CO;2-J.

Anders0n C. et al: "Multiple Preparation Magnetic Resonance Fingerprinting (MP-MRF): An Extended MRF Method for Multi-Parametric Quantification", Pr0ceedings 0f the Internati0nal S0ciety for Magnetic Res0nance in Medicine, 23nd Annual Meeting and Exhibiti0n, T0r0nt0, Canada, May 30-Jun. 5, 2015May 15, 2015, vol. 23, May 15, 2015 (May 15, 2015), p. 3387.

Brittain JH, et a. Nishimura DG. Coronary angiography with magnetization-prepared T2 contrast. Magn Reson Med. May 1995;33(5):689-96.

Dan Ma et al: "Music-based magnetic resonance fingerprinting to improve patient comfort during MRI examinations",Magnetic Resonance in Medicine.,vol. 75, No. 6, Jul. 16 2015 (Jul. 16, 2015),pp. 2303-2314.

M. Weiger et al: "MRI with Zero Echo Time" In: "Encyclopedia of Magnetic Resonance",Jun. 15, 2012 (Jun. 15, 2012), John Wiley & Sons, Ltd, Chichester, UK, XP055168958,ISBN:978-0-47-003459-0 pp. 312.

Peter Börnert et al: "ZTE for Whole Heart Imaging—Initial Results, Limitations and Challenges at 1.5T", Proceedings of the International Society for Magnetic Resonance in Medicine, 23nd Annual Meeting and Exhibition, Toronto, Canada, May 30-Jun. 5, 2015, vol. 23, May 15, 2015 (May 15, 2015), p. 2663.

Hoerr Verena et al: "Magnetic resonance imaging characterization of microbial infections", Journal of Pharmaceutical and Biomedical Analysis,vol.93, Nov. 7, 2013 (Nov. 7, 2013), pp. 136-146.

* cited by examiner

SILENT 3D MAGNETIC RESONANCE FINGERPRINTING

CROSS REFERENCE TO RELATED APPLICATIONS

This application is a U.S. national phase application of International Application No. PCT/EP2017/059876, filed on Apr. 26, 2017, which claims the benefit of U.S. provisional Application Ser. No. 62/327,647 filed on Apr. 26, 2016 and EP Application Serial No. 16172560.1 filed Jun. 2, 2016 and is incorporated herein by reference.

FIELD OF THE INVENTION

The invention relates to magnetic resonance imaging, in particular to magnetic resonance fingerprinting.

BACKGROUND OF THE INVENTION

Magnetic Resonance (MR) fingerprinting is a technique where a number of RF pulses often associated with appropriate gradient switching, distributed in time, are applied such that they cause signals from different materials or tissues to have a unique contribution to the measured MR signal. A dictionary of precalculated signal contributions from a large set or a fixed number of substances is compared to the measured MR signals within each single voxel. Furthermore, also the composition within each voxel can further be determined. For example if it is known that a voxel only contains water, fat, and muscle tissue the contribution from these three materials need only be considered and only a few RF pulses are needed to accurately determine the composition of the voxel. If a larger dictionary with higher resolution is used, MR fingerprinting can be used to determine different tissue parameters of a voxel (such as T1, T2, . . . ) simultaneously and quantitatively.

The magnetic resonance fingerprinting technique was introduced in the journal article Ma et al., "Magnetic Resonance Fingerprinting," Nature, Vol. 495, pp. 187 to 193, doi:10.1038/nature11971. The magnetic fingerprinting technique is also described in United States patent applications US 2013/0271132 A1 and US 2013/0265047 A1.

United States patent application US 2015/0070012 discloses a method of optimizing sounds produced during nuclear magnetic resonance (NMR) fingerprinting. One example NMR apparatus includes an NMR logic to repetitively and variably sample a (k, t, E) space associated with a patient to acquire a set of NMR signals. Members of the set of NMR signals are associated with different points in the (k, t, E) space. Sampling is performed with t and/or E varying in a non-constant way. The varying parameters may include flip angle, echo time, RF amplitude, and other parameters. The parameters are varied in different acquisition blocks to facilitate matching sounds produced in response to the acquisition blocks to a desired set of sounds. The desired set of sounds may be a musical piece.

SUMMARY OF THE INVENTION

The invention provides for a magnetic resonance imaging system, a computer program product and a method in the independent claims. Embodiments are given in the dependent claims.

Examples may use a modified magnetic resonance fingerprinting technique that combines longitudinal magnetization preparation pulses with Zero Echo Time (ZTE) spatial encoding. The longitudinal magnetization preparation pulses are used for the magnetic resonance fingerprinting encoding and the ZTE provides for three dimensional spatial encoding. The combination of the two may have several benefits. Firstly the variety of tissue types that can be classified may be increased to include tissues with which might be considered very short T2 relaxation times such as bone or other connective tissue. Secondly a pulse sequence which eliminates or significantly reduces acoustic noise can be constructed.

The Nature article by Ma et al. introduces the basic idea of magnetic resonance fingerprinting and terminology which is used to describe this technique such as the dictionary, which is referred to herein as a "pre-calculated magnetic resonance fingerprinting dictionary," a "magnetic resonance fingerprinting dictionary," and a "dictionary."

Magnetic Resonance (MR) data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect, the invention provides for a magnetic resonance imaging system for acquiring magnetic resonance data from a subject within an imaging zone. The magnetic resonance imaging system comprises a memory for storing machine-executable instructions. The memory further stores pulse sequence commands. Pulse sequence commands are commands which can be used for controlling the acquisition of a magnetic resonance imaging system or the pulse sequence commands are data which can be readily converted into such commands for directly controlling the magnetic resonance imaging system. The pulse sequence commands, when executed by the components of the magnetic resonance imaging system, cause the magnetic resonance imaging system to acquire the magnetic resonance data according to a magnetic resonance fingerprinting technique. In other words, the magnetic resonance data that is acquired may be analyzed according to a magnetic resonance fingerprinting technique to determine the spatial distribution of a set of predetermined substances. The pulse sequence commands are configured to control the magnetic resonance imaging system to perform spatial encoding using a zero echo time magnetic resonance imaging protocol.

The magnetic resonance imaging system further comprises a processor for controlling the magnetic resonance imaging system. Execution of the machine-executable instructions further cause the processor to acquire the magnetic resonance data by controlling the magnetic resonance imaging system with the pulse sequence commands. Execution of the machine-executable instructions further cause the processor to calculate a spatial distribution of each of the set of predetermined substances by comparing the magnetic resonance data within a magnetic resonance fingerprinting dictionary. The magnetic resonance fingerprinting dictionary contains a listing of calculated magnetic resonance signals in response to execution of the pulse sequence commands for the set of predetermined substances.

This embodiment may have the advantage that significantly less noise is produced when the magnetic resonance data is acquired. In zero echo time pulse sequences the imaging gradient is actually switched on all the time. It is present during the RF pulse and the signal sampling. The magnetic gradient strength is constant, only the gradient orientation slightly changes from TR to TR (repletion time). This is in contrast to many other magnetic resonance imaging techniques where the magnetic gradient fields are pulsed. This pulsing of the magnetic gradient fields within the homogenous main Bo field causes substantial acoustical because the magnet and the magnetic gradient coils form a kind of a bad loudspeaker. In addition to reducing the acoustic noise the use of the zero echo time magnetic resonance imaging protocol enables the imaging of tissues which have short T2 times. For example bone tissue, cartilage, and other connective tissues are typically not able to be imaged using standard clinical imaging techniques. By incorporating magnetic resonance fingerprinting into the zero echo time spatial encoding it may be possible to map a spatial distribution of predetermined substances in tissues which were previously not possible with other magnetic resonance fingerprinting techniques.

In another embodiment, the pulse sequence commands comprise multiple groups of longitudinal magnetization preparations. A longitudinal magnetization may also be referred to as a Mz-magnetization. Each of the group of longitudinal magnetization preparations is followed by a zero echo time readout block. Each zero echo time readout block acquires a portion of the magnetic resonance data. Each of the multiple groups of longitudinal magnetization preparations may be a single longitudinal magnetization preparation or several longitudinal magnetization preparations may be performed. By providing these different longitudinal magnetization preparations one means of providing the magnetic resonance fingerprinting encoding is provided. For example the magnetic resonance fingerprinting may be encoded by forming different groups or variants of different longitudinal magnetization preparations. This embodiment may be beneficial because it may provide an efficient means of mapping the spatial distribution of substances within a subject.

In another embodiment, each of the multiple groups of longitudinal magnetization preparations is followed by a zero echo time readout block. The zero echo time readout block then causes the MS system to acquire a portion of the magnetic resonance data. This portion of magnetic resonance data may be reconstructed into an image. This may then be done for each zero echo time readout block. The result is a series of images. The value of a particular voxel throughout all of this series of images may then be stored as a vector. This vector can be considered to be the magnetic resonance fingerprint in image space.

The vector can then be compared to the magnetic resonance fingerprint dictionary to determine the amounts of each of the set of predetermined substances within that voxel. When this is repeated for each of the voxels the amounts of each of the set of predetermined substances within all of the voxels can be used to construct the spatial distribution of each of the set of predetermined substances. This embodiment may have the benefit of producing an accurate spatial distribution of each of the set of predetermined substances even when the k-space is subsampled. If the zero echo time readout blocks are subsampled then there may be image artifacts in the resulting images.

However, the process of matching the vector to the magnetic resonance fingerprinting dictionary may be used to reject the image artifacts. In the vector, some elements will contain a value which has a contribution from an image artifact. This is equivalent to noise and can be rejected by a fitting process. This scheme can be made to work even better if there are variations in the zero echo time readout block such as varying the sampling trajectory in k-space slightly. This destroys coherence between the image artifacts and enables the image artifacts to be better rejected as noise.

In another embodiment, each of the multiple groups of longitudinal magnetization preparations comprises one or more of the following: inversion recovery preparation, T2 preparation based on a driven equilibrium preparation, an unbalanced T2 preparation, a T2 preparation using diffusion sensitizing and weighting, MSDE, a T2 preparation using flow sensitizing and weighting, spin inversion preparation, partial saturation recovery, magnetization transfer contrast preparation, chemical shift selective pre-saturation, a stimulated-echo preparations, a NO preparation, and combinations thereof.

A "NO" preparation is a step where a longitudinal magnetization preparation is not performed and in its place a pause of adjustable duration is made. The use of any of the above mentioned longitudinal magnetization preparations may be beneficial because they are compatible with a zero echo time spatial encoding. It should be noted that multiple of these preparations may be performed before a zero echo time spatial encoding. Also within each of these, various parameters may be varied. The MR fingerprinting encoding can be performed by either varying a choice of which preparation is used or by modifying the parameters within a particular magnetization preparation.

In another embodiment, the magnetic resonance fingerprinting encoding is performed by varying individual longitudinal magnetization preparations within the multiple groups of longitudinal magnetization preparations. This embodiment may be beneficial because the same magnetization preparations may be repeated but parameters within the individual longitudinal magnetization preparation may be modified. The sequence of which magnetization preparations are performed may also be altered or changed. In other examples individual parameters are modified. For example a T2 preparation has an echo time (TE-prep). As part of the magnetic resonance fingerprinting encoding this echo time may be varied.

In another embodiment, the portion of the magnetic resonance data is a sub-sample of a complete k-space sample. Usually in conventional MRI to perform an imaging sequence the Nyquist theorem should be fulfilled. If less data than this is acquired then the data is sub-sampled. The magnetic resonance fingerprinting technique is relatively robust with respect to data-rejecting noise. This enables the sampling of the magnetic resonance data to be sub-sampled in a way which enables the acceleration of the technique.

In another embodiment, each zero echo time block reads out a different sub-sample pattern from an adjacent zero echo time readout block. The varying of the sub-sample pattern may be beneficial because this spoils the coherence of the noise between different groups of magnetic resonance data. For example if the magnetic resonance data were sub-sampled and the same positions in k-space were sampled every single time, then there would be coherence between the noise of the magnetic resonance data acquired for each spatial encoding. This would introduce systematic artifacts and errors in the images reconstructed form the sub-sampled images. These artifacts may compromise the matching process between the sampled signals for each voxel and the signal distributions calculated using the magnetic resonance fingerprinting dictionary. However, if the region of k-space which is sampled is changed between separate acquisitions of a portion of the magnetic resonance data then the noise coherence in the resulting Fingerprinting imaging data is spoiled. When the magnetic resonance fingerprinting dictionary is used to determine the corresponding material, specie or T1/T2/etc.—tuple these different noise contributions from the reconstructed differently sub-sampled bits of magnetic resonance data may then have the effect of cancelling/averaging out. This may enable the acceleration of the magnetic resonance fingerprinting greatly. Different sub-sampling patterns may be used. For example, performing the ZTE acquiring the magnetic resonance data as spokes then spirals on a sphere in k-space may be beneficial. Between different TRs, spatial encodings the k-space, which is read out, may be slightly rotated then.

In another embodiment, the multiple groups of longitudinal magnetization preparations are divided into one or more subsets. Within each of the one or more subsets you may have a unique flip angle. For example, different sets of magnetic resonance data could be acquired for different flip angles. With the zero echo time spatial encoding the flip angle may be limited to about 5° in some cases because signal excitation takes place in the presence of the read-out gradient. One could acquire different groups of magnetic resonance data say for 5, 4, 3, 2, 1 and/or other degrees in between these. This little variation could additionally be used to encode magnetic resonance fingerprinting information. A separate magnetic resonance fingerprinting dictionary might be constructed for each flip angle that is used. In one variant, the acquisition for each flip angle may be performed as a block. In other examples the data may be acquired in an interleaved fashion.

In another embodiment, execution of the machine-executable instructions further causes the processor to calculate the spatial distribution of each of the set of predetermined substances for each of the one or more subsets. This may provide for separate spatial distributions for each of the set of predetermined substances. Some substances may be better imaged better using different flip angles. Also providing for the separate data analysis may provide for a way of correcting errors or faults caused by sub-sampling the k-space.

In another embodiment, the one or more subsets are interleaved. This may also include changing the sub-sampling pattern as the different groups are acquired. This may also destroy the noise coherence between the different subsets. Having the separate subsets may then provide for a means of rejecting the coherence of noise.

In another embodiment, at least one of the longitudinal magnetization preparations comprises silent magnetic gradient transitions. In some of the longitudinal magnetization preparations there may be a change in a value or strength of a magnetic gradient field. This may be done by changing the current supplied to a gradient coil in the magnetic resonance imaging system. A silent magnetic gradient transition as used herein is a change in a value in the current applied to a magnetic gradient coil that is done smoothly enough such a loud acoustic noise is not generated. For example the acoustic noise may be below a particular threshold. In other examples, this may be defined by eliminating the slew rate or the rate of change in the current applied to a magnetic gradient coil. As the magnetization preparations are used for encoding the magnetic resonance fingerprinting and not in the traditional use for magnetization preparations they may be constructed somewhat differently than is typically used. For example in a magnetization where the current changes abruptly, it may still function when the rate of change and the amplitude in the current supplied to the gradient coil is limited. The rate of change and the amplitude of the gradient current is appropriately adopted to the specific needs of the particular longitudinal magnetization preparation. Some of the envisioned longitudinal magnetization preparation are spatially non-selective because the zero echo time imaging approach is 3D.

In another embodiment, the set of predetermined substances comprises any one of the following: bone tissue, connective tissue, cartilage, spongy bone, cortical bone, and tendons. The imaging of any of these may be beneficial because they have what is considered to be a short T2 relaxation time. Imaging these during the magnetic resonance fingerprinting technique may enable these tissue types to be identified in a quantitative fashion along with other tissues.

In another embodiment, execution of the machine-executable instructions further causes the processor to calculate a synthetic computer tomography image using at the least the spatial distribution of the bone tissue. As the bone tissue can be measured directly such as cortical bone or spongy bone tissue, this enables a precise determination of the location of bone tissue. In this embodiment, the location of the bone tissue is determined quantitatively as opposed to performing an image segmentation. This may enable the more accurate construction of so called synthetic computer tomography images. The synthetic computer tomography image may for example be used as a diagnostic tool by a physician who is more accustomed to looking at computer tomography images than to magnetic resonance images or to maps of spatial distribution of substances. The synthetic computer tomography image may also be useful in radiation therapy planning There are many existing software tools where the computer tomography images are used for radiation therapy planning Using the synthetic computer tomography image may provide for a safer and more accurate means of performing the radiation therapy planning In another embodiment, execution of the machine-executable instructions further causes the processor to calculate a synthetic three-dimensional magnetic resonance image using the spatial distribution of each of the set of predetermined substances. As a spatial distribution of each of the set of predetermined substance is known it is able to be used to calculate a synthetic magnetic resonance image. This may be particularly useful for physicians who are accustomed to reading magnetic resonance images and may be confused by a mapping of the spatial distribution directly.

In another embodiment, execution of the machine-executable instructions further causes the processor to calculate the magnetic resonance fingerprinting dictionary by modeling the response of each of the predetermined substances to the pulse sequence commands. This may provide for an efficient means of varying the magnetic resonance fingerprinting. Such a dictionary could be calculated for different variants also. For example if there were different sub-groups using different flip angles there may be a different magnetic resonance fingerprinting dictionary calculated for each of the flip angles.

The actual calculation of the magnetic resonance fingerprinting dictionary may be performed by any number of a variety of techniques for modeling the NMR signal. For example it may be modeled by adding up a large number of single spins calculated using the so called Bloch equations. The dictionary is created by calculating the expected NMR signal from a voxel for a specific set of substance parameters and the particular MR sequence that is specified by the pulse sequence commands.

In another embodiment, the magnetic resonance fingerprinting dictionary is calculated by modeling each of the predetermined substances using an extended phase graph formulation. The extended phase graph formulation is for example described in Weigel, M. (2015), Extended phase graphs: Dephasing, RF pulses, and echoes—pure and simple. J. Magn. Reson. Imaging, 41: 266-295. doi: 10.1002/jmri.24619 and is also described in Scheffler, K. (1999), A pictorial description of steady-states in rapid magnetic resonance imaging. Concepts Magn. Reson., 11: 291-304. doi: 10.1002/(SICI)1099-0534(1999)11:5<291::AID-CMR2>3.0.CO;2-J.

In another embodiment, the pulse sequence is modified to increase the sampling of central k-space. When a ZTE pulse sequence is performed the gradient is always on. This means that as soon as an RF pulse is applied the sampling of the central region of k-space begins. Often times, this is not a difficulty. In research magnetic resonance imaging systems there may be expensive RF switching units which allow quick switching between transmitting RF and receiving data. In this case only a small portion of k-space is not sampled. This can easily be handed in the appropriate images reconstruction and would not affect the end result.

In some clinical magnetic resonance imaging systems the electronics may not be able to switch so quickly. A number of modifications to the pulse sequence can be made to increase the sampling of central k-space and increase the quality of the calculated spatial distribution. For example, during one of the zero echo time readout blocks the strength of the gradient magnetic field can be reduced to reduce the trajectory through k-space. For example the strength of the gradient magnetic field could be reduced by a factor of approximately 5 to 10. In another example, the gradient magnetic field could be turned off for one or more zero echo time readout blocks to enable the sampling of the center of k-space (k=0). In another embodiment a hybrid readout scheme could be used to read out one or more portions of the magnetic resonance data. For example, a phase encoded measurement could be used to read the value of central k-space in one or more blocks.

In another aspect, the invention provides for a computer program product comprising machine-executable instructions for execution by a processor controlling the magnetic resonance imaging system for acquiring magnetic resonance data from a subject within an imaging zone. Execution of the machine-executable instructions causes the processor to acquire the magnetic resonance data by controlling the magnetic resonance imaging system with the pulse sequence commands. The pulse sequence commands are configured to cause the magnetic resonance imaging system to acquire the magnetic resonance data according to a magnetic resonance fingerprinting technique. The pulse sequence commands are further configured to control the magnetic resonance imaging system to perform spatial encoding using a zero echo time magnetic resonance imaging protocol.

Execution of the machine-executable instructions further cause the processor to calculate a spatial distribution of each of the set of predetermined substances by comparing the magnetic resonance data with the magnetic resonance fingerprinting dictionary. The magnetic resonance fingerprinting dictionary contains a listing of calculated magnetic resonance signals in response to execution of the pulse sequence commands for the set of predetermined substances.

In another aspect, the invention provides for a method of operating the magnetic resonance imaging system. The magnetic resonance imaging system is configured for acquiring magnetic resonance data from a subject within an imaging zone. The method comprises acquiring the magnetic resonance data by controlling the magnetic resonance imaging system with pulse sequence commands. The pulse sequence commands are configured to cause the magnetic resonance imaging system to acquire the magnetic resonance data according to a magnetic resonance fingerprinting technique. The pulse sequence commands are further configured to cause the magnetic resonance imaging system to perform spatial encoding using a zero echo time magnetic resonance imaging protocol. Corresponding 3D images are reconstructed from each of the sub-sampled zero echo time magnetic resonance imaging data measured after each longitudinal magnetization preparation. Those data form a 4D data set representing the fingerprints for each of the reconstructed voxels. The method further comprises matching the measured fingerprints e.g. with a set of predetermined substances by comparing the magnetic resonance data with a magnetic resonance fingerprinting dictionary. The magnetic resonance fingerprinting dictionary contains a listing of calculated magnetic resonance signals in response to execution of the pulse sequence commands for the set of predetermined substances.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
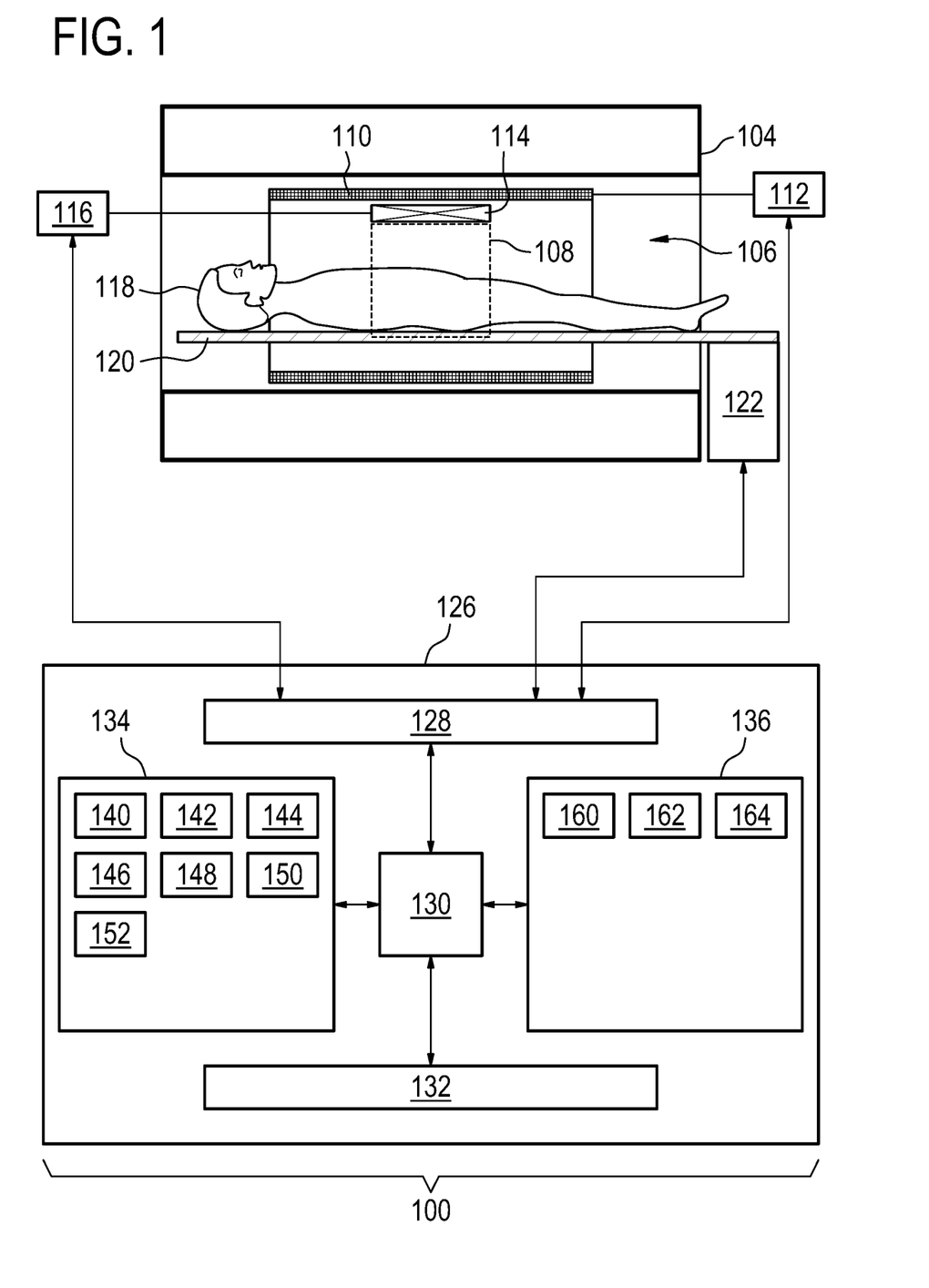
FIG. 1 illustrates an example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

The transceiver 116 and the magnetic field gradient coil power supply 112 are all connected to a hardware interface 128 of computer system 126. The contents of the computer storage 134 and the computer memory 136 may be duplicated or exchanged with each other. The computer storage 134 is shown as containing pulse sequence commands 140. The computer storage 134 is further shown as containing magnetic resonance data 142 that was acquired by controlling the magnetic resonance imaging system 100 with the pulse sequence commands 140. The computer storage 144 is further shown as containing a magnetic resonance fingerprinting dictionary 144. The computer storage 134 is further shown as containing a spatial distribution of a set of predetermined substances 146 that was calculated using the magnetic resonance fingerprinting dictionary 144 and magnetic resonance data 142.

The computer storage 134 is further shown as containing a mapping. The mapping 148 may for instance be an image or image data which is calculated using the spatial distribution 146. The computer storage 134 is shown as optionally containing a synthetic magnetic resonance image 150 that was calculated using the spatial distribution 146. The computer storage 134 is further shown as containing a synthetic computer tomography image 152 that was also optionally calculated using the spatial distribution 146. When the spatial distribution 146 of the predetermined substances is known these can be used to create the simulated images such as the synthetic computer tomography image 152 or the synthetic magnetic resonance image 150.

The computer memory 136 is shown as containing machine-executable instructions 160. The machine-executable instructions 160 enable the processor 130 to perform various functions like controlling the magnetic resonance imaging system 100 with the pulse sequence commands 140 or for performing analysis and processing of the magnetic resonance data 142. The computer memory 136 is further shown as containing a magnetic resonance fingerprinting model 162. This may be used to model the free induction decay or received MR signals by a particular substance when exposed to an MR system executing the pulse sequence commands 140. These for instance may be used by the processor 130 to calculate the magnetic resonance fingerprinting dictionary 144. The computer memory 136 may also contain various image processing routines 164 or instructions. These may enable the processor 130 to perform various image processing tasks such as rendering the mapping 148 or calculating and rendering the synthetic magnetic resonance image 150 and/or the synthetic computer tomography image 152.

Figure 2:
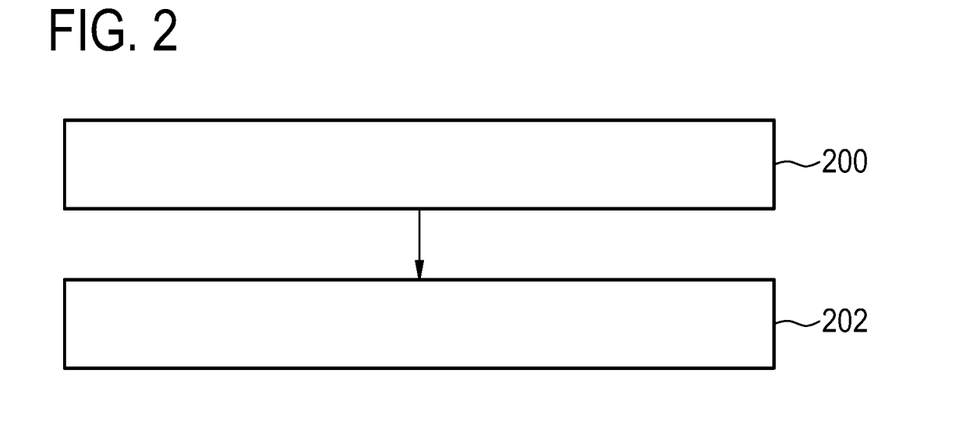
FIG. 2 shows a flow chart which illustrates a method of using the magnetic resonance imaging system of FIG. 1.

FIG. 2 shows a flowchart which illustrates a method of operating the magnetic resonance imaging system 100 of FIG. 1. First in step 200 the magnetic resonance data 142 is acquired by controlling the magnetic resonance imaging system 100 with the pulse sequence commands 140. The pulse sequence commands 140 are configured to cause the magnetic resonance imaging system 100 to acquire the magnetic resonance data 142 according to a magnetic resonance imaging fingerprinting technique. The pulse sequence commands 140 are further configured to cause the magnetic resonance imaging system 100 to perform spatial encoding using a zero echo time magnetic resonance imaging protocol. Next in step 202 a spatial distribution 146 for each of a set of predetermined substances is calculated by comparing the magnetic resonance data 140 with a magnetic resonance fingerprinting dictionary 144. The magnetic resonance fingerprinting dictionary 144 contains a listing of calculated magnetic resonance signals in response to execution of the pulse sequence commands 140 for the set of predetermined substances.

Magnetic Resonance Imaging (MRI) has a great soft tissue contrast and is one of the most versatile imaging modalities. Quantitative Magnetic Resonance (MR) techniques are desirable to reduce the huge variety of contrasts and/or to make findings more comparable to draw diagnostic conclusions. Furthermore, if the underlying MR parameter information is available for each voxel within a certain Field of View (FOV) almost all kind of MR contrasts can be synthesized (synthetic imaging) mimicking the MR acquisition of the corresponding contrasts without being forced to do the actual acquisition.

Quantitative MRI (qMRI) with its ability to give numbers, which are comparable and quantifiable, is a very promising approach to identify important biomarkers that can ease this task. Two main approaches to qMRI exist. In the traditional one, most MR parameters of an experiment are kept fixed and only one is varied to measure a specific tissue parameter (either T1, or T2, or etc.). In the MR Fingerprinting (MRF) approach, all signal influencing parameters (T1, T2, etc.) are encoded simultaneously by the MR Fingerprinting sequence and the species in question are identified by matching the acquired signal to a previously generated dictionary containing a large number of signals corresponding to different parameter combinations or species.

However, the MR challenge, the sequence of RF pulses with different flip angles, phases, and timings, etc. along with the employed imaging gradient, which facilitate spatial signal encoding, can result in a rather uncomfortable and loud sound which annoys and may scare the patient. Although attempts have been made to adapt the MRF sequences to music, a silent execution would be desirable to increase patient comfort. Furthermore, an adaptation to music or specific sounds results in a relative loss in efficiency and therefore an increase in time as well.

Additionally, it is desirable to obtain the quantitative information in a 3D manner, in contrast to the currently used single- or multi-slice approach, which may obscure pathology. Examples use the silent Zero Echo Time (ZTE) sampling approach for spatial encoding in the MRF- or MR parameter mapping-sequence. Due to its volumetric nature, the ZTE sequence facilitates a volumetric mapping of basic MR parameters. ZTE as a sequence supports 'per se' MR parameter mapping for fast T2 relaxing components which are otherwise invisible to conventional MRI. This ability could represent another feature of the proposed approach allowing potentially the mapping of components today's clinical MR is often blind to. This implies that the dictionary may include atypical MR parameters that are more related to CT findings associated with solids.

The use of ZTE imaging implies that MRF parameter has to be performed exclusively via longitudinal magnetization or Mz-magnetization preparation, which differs from the existing MRF concepts.

The ZTE sequence may be based on a 3D radial sampling. Free Induction Decay (FID) signals are sampled on an in-out radial trajectory (starting in the center of k-space). The temporal order of these in-out radial trajectory vectors (spokes) is organized via a number of interleaves using smooth spirals which running from step to step (from spoke to spoke, from TR to TR) on a surface of a sphere from the north to the south pole of the sphere. In this way the 3D k-space can be traversed in a segmented way using a number of those interleaves. In the ZTE sequence the read-out gradient is switched on all the time but is changing from shot to shot, from spoke to spoke only slightly its orientation, facilitating almost silent operation.

Figure 3:
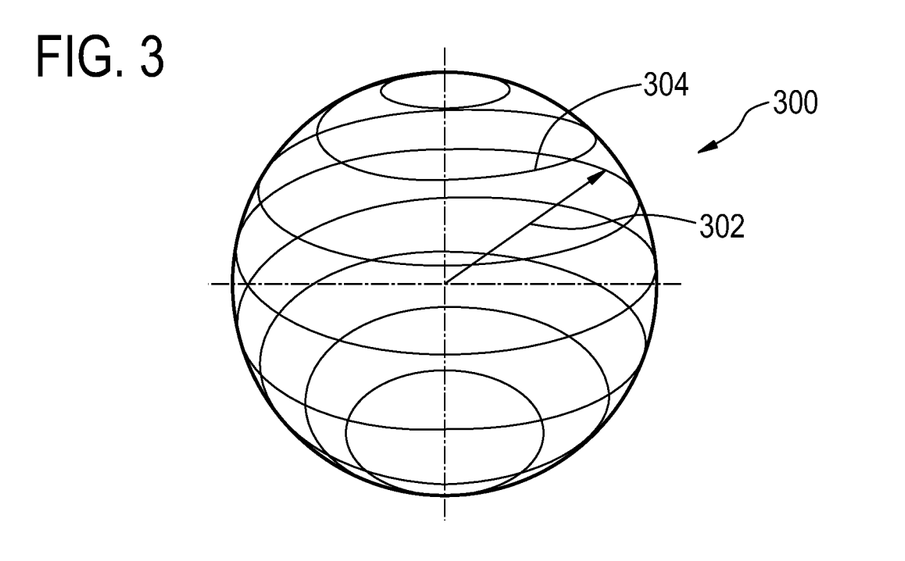
FIG. 3 illustrates an example of a trajectory in k-space.

FIG. 3 is used to illustrate a three-dimensional radial sampling scheme for a zero echo time spatial encoding. FIG. 3 shows a sphere 300 in k-space. The arrow 302 indicates the k-space trajectory of a single free induction decay or spoke sampled in the ZTE sequence. The spiral line 304 on the surface of the sphere 300 shows the path of the spoke 302 during a single interleaved or sampling event. The trajectory 304 represents a full sampling of the k-space which satisfies the Nyquist theorem. FIG. 3 illustrates the 3D radial sampling scheme. The arrow indicates the k-space trajectory of a single FID (spoke 302) sampled in the ZTE sequence. In a single interleave (304) the spokes spiral from north to South Pole on the surface of a sphere. A full k-space acquisition can consist out of a number of interleafs covering k-space densely.

The advantage of the ZTE sequence is the ability to allow sampling at very short echo times; this way very short T2 components can be detected. However, the drawback of this silent sequence is that it does not allow for large changes in echo time (TE) (only very minor ones are conceivable: several micro second range), which actually means the TE is fixed.

Furthermore, ZTE may possibly be limited in the maximal flip angle to be applied. For example, the maximal flip angle might be approximately 5 degrees. This is mainly the consequence of the fact that RF excitation takes place in the presence of the read-out gradient. The duration of the RF pulse is thus limited because it has to have a high bandwidth exciting the entire FOV. Due to the finite max B1+ in clinical systems ZTE is limited to only very small excitation flip angles (below 5 degrees) restricting potential RF flip angle induced contrast variation (mainly T1-contrast).

Example of key elements of the traditional MRF challenge concept as they are:

Changing the flip angle in the MRF train
Changing the TE in the MRF train
Changing the TR in the MRF train The flip angle can be changed in a ZTE pulse sequence, but not as much as in a conventional MRI pulse sequence. Likewise the varying of the TE is also more restricted in ZTE also. Due to the low flip angle ($\alpha$) it is likely not beneficial to vary the TR in the pulse sequence for MRF encoding. Explicitly, this means approaches that are based on the manipulation of the transverse magnetization (by high flip angles, or by varying TE/TR) are likely not beneficial or may not work well when performing ZTE-MRF.

Surprisingly, Mz-magnetization preparation schemes may be applied instead as MRF challenges to encode the corresponding MR parameter information into the longitudinal magnetization appropriately. Here for example (but not limited to) a number of basic Mz-magnetization preparation schemes are conceivable:

Inversion recovery preparation (varying the inversion pulse angle and the inversion time TI)

T2 preparation based on a driven equilibrium preparation (varying the preparation echo time TEprep)

Unbalanced T2 preparation schemes (means the fast 90° RF tip up is shifted with respect to RF induced echo—in this way, chemical shift, $\Delta Bo$, and $T2^*$ could be encoded)

T2 preparation based on a driven equilibrium preparation with diffusion sensitizing gradients on top MSDE preparation (flow/diffusion weighted T2 preparation)

MTC preparation

Chemical shift selective pre-saturation

All kind of dedicated stimulated-echo preparations

And others

For this purpose a magnetization prepared MRF-ZTE sequence is designed. The basic sequence building stone can be seen in FIG. 4 below with different options conceivable shown in FIG. 5 below and FIG. 6 below, respectively. Before and after the different preparations (T1, T2, fat off-resonance saturation, unbalanced T2 preparation, Diffusion prep., . . . ) individual relaxation delays might be applied although filling those delays with appropriate ZTE sampling blocks might be more efficient. Such an Mz-magnetization preparation is followed by a block of low angle ZTE read-outs which are not significantly influencing the Mz. Due to the radial acquisition, k-space center is measured in each acquisition, contrast smoothing takes place via time-averaging the magnetization response. During the dictionary design this effect can be taken into consideration.

Figure 4:
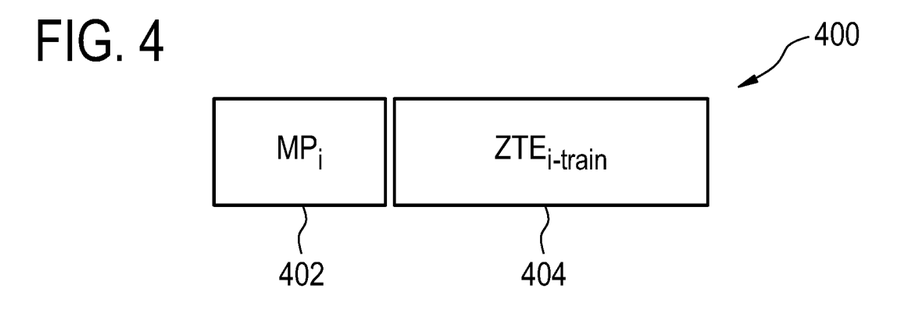
FIG. 4 shows an example of a portion of a pulse sequence.

FIG. 4 illustrates a basic building block 400 of the pulse sequence commands. The block labeled 402 is a magnetization preparation. The block 404 represents a ZTE spatial encoding sequence. The overall pulse sequence will be made up of a series of building blocks 400 similar to that shown in FIG. 4.

As already mentioned, FIG. 4 Shows the basic MRF-ZTE sequence building stone, a general Mz-magnetization preparation scheme (MPi) is preceding the actual ZTE sampling block consisting out of a train of spokes. Many Mz-magnetization preparation schemes can be employed, the MPi—block can contains a pre-preparation delay, the actual Mz—step and a post-preparation delay (not detailed out here). The entire MRF-ZTE sequence consists of a number of those blocks (i) in which the type of Mz-preparation, the delay durations (pre, post if applicable) and the number of ZTE read-out spokes can be individually varied (c.f. (b,c)). Furthermore, the ZTE k-space trajectory can be sampled in different ways.

Figure 5:
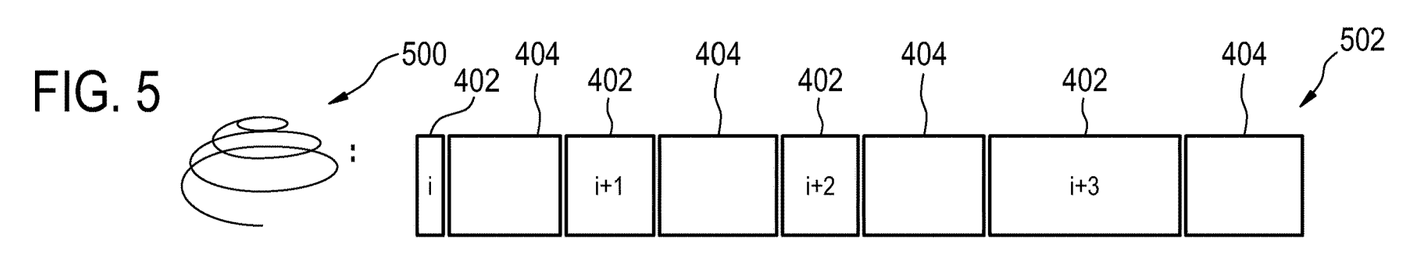
FIG. 5 illustrates an example of a pulse sequence.

FIG. 5 is used to illustrate one sampling scheme. The trajectory 500 is a 3D radial spiral on a sphere trajectory on k-space similar to that shown in FIG. 3. However, in this example the trajectory 500 is under-sampled. To the right of the k-space trajectory 500 is an example of a pulse sequence 502. The pulse sequence 502 is made up of a number of magnetization preparations 402 and ZTE spatial encoding sequences 404. Each of the ZTE spatial encoding sequences 404 use the same under-sampling trajectory 500 in k-space except that for each of the ZTE spatial encoding sequences 404 the trajectory 500 is slightly rotated in k-space. An advantage of doing this is that this breaks the noise coherence between the differently sampled data. This may enable reconstructing the overall spatial distribution using a smaller amount of acquired data. In this example the magnetization preparation 402 in each case are different. In a first instance this one magnetization is used once. This is labeled i. In the next magnetization 402 labeled i+1 another magnetization is performed or a parameter of this longitudinal magnetization preparation is changed. As an example the given sub-set of longitudinal magnetization preparation shown in FIG. 5 are of the same kind, e.g. a T2 preparation based on a driven equilibrium preparation. In the magnetization preparation 402 labeled i the sequence has a TEprep of 20 ms, in the preparation 402 labeled i+1 the TEprep was increased to 40 ms, in the preparation labeled i+2 the TEprep was increased to 80 ms whereas in preparation i+3 a TEprep 120 ms was used for example.

FIG. 5 uses a full but differently (rotated) interleaf after each different preparation, note the length of the ZTE spokes block is fixed or as sketched in FIG. 6 below along an interleaf, where a sub-group of data is sampled after the corresponding preparations, please note that the length of the ZTE spokes block can be vary.

Figure 6:
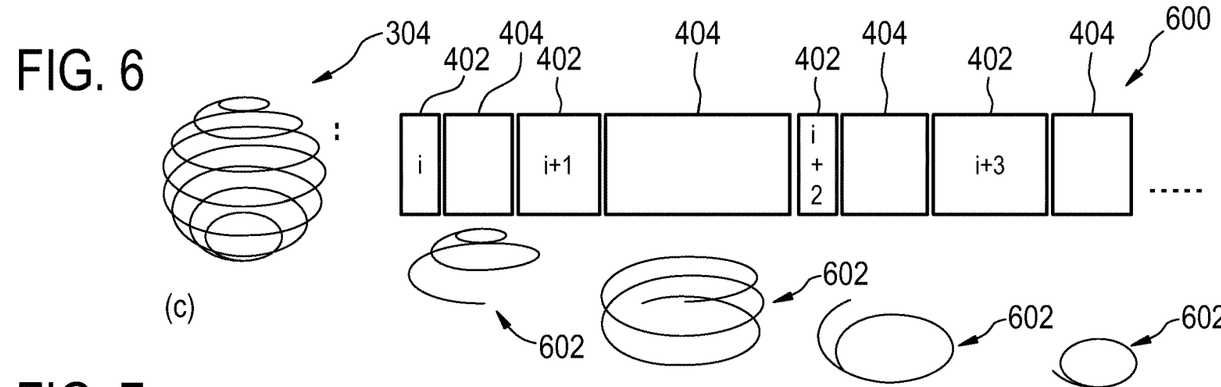
FIG. 6 illustrates a further example of a pulse sequence.

FIG. 6 shows a further sampling scheme which may be used. The full k-space trajectory 304 is shown to the left. In this example along an interleaf a sub-group of data is sampled and the corresponding preparations. The length of the ZTE spoke blocks may be variable. Below each of the ZTE blocks 404 there is a k-space trajectory fragment 602 which is shown. In this example the k-space is under-sampled by breaking the k-space trajectory 304 into a number of k-space trajectory fragments 602.

The acquisition of those ZTE profiles can be done using a fixed number of shots (fixed duration) grouped as a separate interleave (see FIG. 5), where each interleaf samples a different portion of the 3D k-space. In this way after each interleaf acquisition a new preparation is done.

Another option is to sample along an interleaf. Also in this approach a fixed number of ZTE profiles can be sampled after preparation. To ease reconstruction in this approach the MRF encoding sequence has to be repeated to facilitate sampling of further parts of the interleaves at the given contrast. As result a number of interleaves have fully been measured with the same sequence of MPi MRF-preparation pulses. If one drops the restriction of sampling a fixed number of ZTE profiles the scheme shown in FIG. 7 below might become applicable. Here everything is variable and might demand for a dedicated MRF reconstruction.

Figure 7:
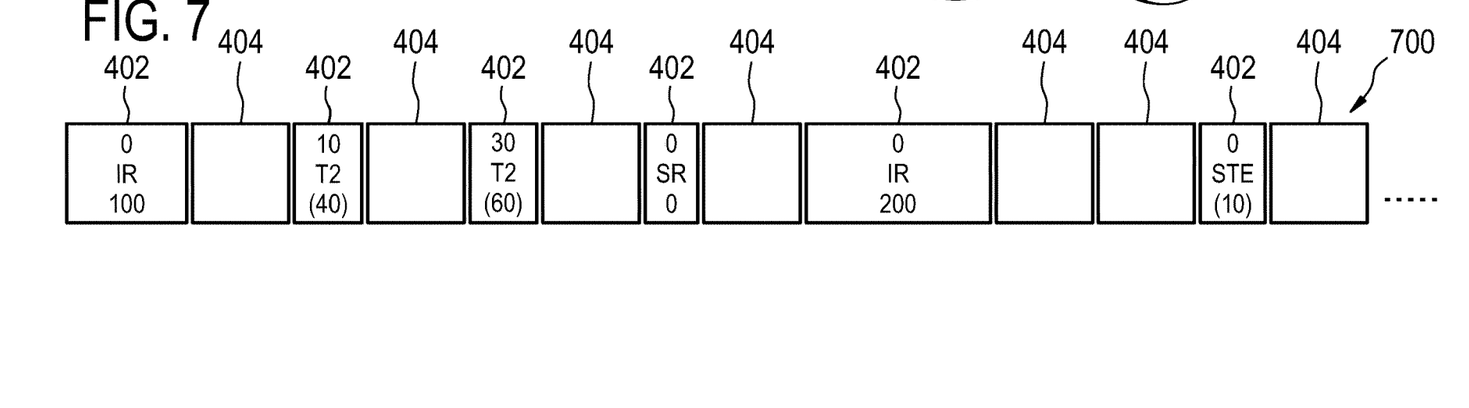
FIG. 7 illustrates a further example of a pulse sequence.

FIG. 7 shows a further example of a pulse sequence 700. In this example different types of magnetization preparations 402 are followed by different ZTE spatial encoding sequences 404. FIG. 7 illustrates how a variety of different magnetization preparations 402 may be combined to form a magnetic resonance fingerprinting pulse sequence. Different Mz-magnetization preparation steps followed by a fixed number of n ZTE read-outs (white blocks). The numbers denote the pre-delay (upper), the post-delay (lower) or when given in brackets the echo-time using no post-delay. It is possible that it might be more efficient to use very short pre- and post-delays and to do ZTE read-out sampling instead. This basic MRF sequence will be repeated until all segments of the specified sub-sampled interleafs have been sampled.

As shown in FIG. 7 the magnetization preparations are interleaved into the ZTE acquisitions. Many Mz-magnetization preparation schemes ask for dedicated gradient pulses that differ from those used in the ZTE train. Therefore, Mz-magnetization preparations and their corresponding gradient pulses are optimized to minimize gradient switching induced acoustic noise (a way doing that would be to reduce gradient strength and slew rate, or to use appropriate smooth sinusoidal waveforms).

One potential advantage of the low tip angel ZTE-train is the low degree of higher order spin coherences generated that might contribute later as spurious echoes. RF spoiling can further help to minimize potential adverse effects if present.

It might be interesting to note that the 3D radial k-space trajectory, segmented in a number of interleaves, is ideally suited for sub-sampling the spatial domain. Thus, in the entire MRF train, consisting on an sufficiently concatenation of the sequences shown in FIG. 2 (b, c) not only the individual MPi are varied but also the 3D radial interleaves to improve the diversity and efficiency of the spatial encoding. This allows to reconstruct MRF information spatially resolved also from spatially under-sampled 3D data. This is essential to keep the total scanning times for this 3D scan within acceptable limits.

Several Examples follow:

A silent, volumetric MRF scan of the brain should be performed with the features like:
volumetric mapping of T1, T2, M0 in the brain
using under-sampling in the spatial domain for faster sampling (only two of the 20 interleaves of the non-under-sampled ZTE scan are sampled, the chosen two ones have maximum distance in k-space (like 0° and 180°)
using a MRF sequence according to the encoding scheme in FIG. 2(b), the interleave number/start angle is linearly increased ($\varphi=360°/20*i$) with time. The 180° opposed interleaves are acquired in a second run of the MRF sequence
at isotropic resolution which allows for reformatting in all directions after MRF reconstruction
dictionary fitting and displaying the corresponding maps
generating images retrospectively with dedicated contrast according desired MR sequences using the concept of synthetic MRI
Scanning could continue until an adequate match is made to any chosen dictionary component using a real-time reconstruction approach. This would allow optimization of the duration of scanning While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
110 magnetic field gradient coils
112 magnetic field gradient coil power supply
114 radio-frequency coil
116 transceiver
118 subject
120 subject support
122 actuator
126 computer system
128 hardware interface
130 processor
132 user interface
134 computer storage
136 computer memory
140 pulse sequence commands
142 magnetic resonance data
144 magnetic resonance fingerprint dictionary
146 spatial distribution of set of predetermined substances
148 mapping
150 synthetic magnetic resonance image
152 synthetic computed tomography image
160 machine executable instructions
162 magnetic resonance fingerprinting model
164 image processing routines
200 acquire the magnetic resonance data by controlling the magnetic resonance imaging system with the pulse sequence commands
202 calculate a spatial distribution of each of a set of predetermined substances by comparing the magnetic resonance data with a magnetic resonance fingerprinting dictionary
300 sphere in k-space
302 spoke
304 k-space trajectory
400 building block
402 magnetization preparation
404 ZTE spatial encoding sequence
500 under sampling trajectory of k-space
502 pulse sequence
600 pulse sequence
602 k-space trajectory fragment
700 pulse sequence

The invention claimed is:

1. A magnetic resonance imaging system for acquiring magnetic resonance data from a subject within an imaging zone, wherein the magnetic resonance imaging system comprises:
a memory for storing machine executable instructions, and pulse sequence commands, wherein the pulse sequence commands are configured to cause the magnetic imaging resonance system to acquire the magnetic resonance data according to a magnetic resonance fingerprinting technique or MR parameter mapping-sequence, wherein the pulse sequence commands are further configured to control the magnetic resonance imaging system to perform spatial encoding using a zero echo time magnetic resonance imaging protocol, a processor for controlling the magnetic resonance imaging system, wherein execution of the machine executable instructions causes the processor to:

acquire the magnetic resonance data by controlling the magnetic resonance imaging system with the pulse sequence commands; and calculate a spatial distribution of each of a set of predetermined substances by comparing the magnetic resonance data with a magnetic resonance fingerprinting dictionary, wherein the magnetic resonance fingerprinting dictionary contains a listing of calculated magnetic resonance signals in response to execution of the pulse sequence commands for the set of predetermined substances and wherein the pulse sequence commands comprises multiple groups of different longitudinal magnetization preparations, the magnetic resonance fingerprinting being encoded by forming different groups or variants of different longitudinal magnetization preparations, wherein each of the multiple groups of longitudinal magnetization preparations is followed by a zero echo time read out block, and wherein each zero echo time read out block acquires a portion of the magnetic resonance data.

2. The magnetic resonance imaging system of claim 1, wherein each of the multiple groups of longitudinal magnetization preparations comprises one or more of the following: inversion recovery preparation, T2 preparation based on a driven equilibrium preparation, an unbalanced T2 preparation, a T2 preparation using diffusion sensitizing and weighting, MSDE, a T2 preparation using flow sensitizing and weighting, spin inversion preparation, partial saturation recovery, magnetization transfer contrast preparation, chemical shift selective pre-saturation, a stimulated-echo preparations, a NO preparation, and combinations thereof.

3. The magnetic resonance imaging system of claim 1, wherein magnetic resonance fingerprinting encoding is performed by varying individual longitudinal magnetization preparations within the multiple groups of longitudinal magnetization preparations.

4. The magnetic resonance imaging system of claim 1, wherein the portion of the magnetic resonance data is a subsample of a complete k-space sample.

5. The magnetic resonance imaging system of claim 4, wherein each zero echo time read out block has a different subsample pattern from an adjacent zero echo time read out block.

6. The magnetic resonance imaging system of claim 1, wherein the multiple groups of longitudinal magnetization preparations are divided into one or more subsets, wherein within each of the one or more subsets has a unique flip angle.

7. The magnetic resonance imaging system of claim 6, wherein execution of the machine executable instructions causes the processor to calculate the spatial distribution of each of a set of predetermined substances for each of the one or more subsets.

8. The magnetic resonance imaging system of claim 6, wherein the one or more subsets are interleafed changing the subsampling pattern over time.

9. The magnetic resonance imaging system of claim 1, wherein at least one of the longitudinal magnetization preparations comprises silent magnetic gradient transitions.

10. The magnetic resonance imaging system of claim 1, wherein the set of predetermined substances comprises any one of the following: bone tissue, connective tissue, cartilage, spongey bone, cortical bone, and tendons.

11. The magnetic resonance imaging system of claim 10, wherein execution of the machine executable instructions causes the processor to calculate a synthetic computed tomography image using at least the spatial distribution of the bone tissue and/or to calculate a synthetic three dimensional magnetic resonance image using the spatial distribution of each of the set of predetermined substances.

12. The magnetic resonance imaging system of claim 1, wherein execution of the machine executable instructions further causes the processor to calculate the magnetic resonance fingerprinting dictionary by modeling the response of each of the predetermined substances to the pulse sequence commands.

13. A computer program product comprising machine executable instructions stored on a non-transitory computer readable medium for execution by a processor controlling a magnetic resonance imaging system for acquiring magnetic resonance data from a subject within an imaging zone, wherein execution of the machine executable instructions causes the processor to:

acquire the magnetic resonance data by controlling the magnetic resonance imaging system with pulse sequence commands, wherein the pulse sequence commands are configured to cause the magnetic resonance imaging system to acquire the magnetic resonance data according to a magnetic resonance fingerprinting technique or MR parameter mapping-sequence, wherein the pulse sequence commands are further configured to control the magnetic resonance imaging system to perform spatial encoding using a zero echo time magnetic resonance imaging protocol; and calculate a spatial distribution of each of a set of predetermined substances by comparing the magnetic resonance data with a magnetic resonance fingerprinting dictionary, wherein the magnetic resonance fingerprinting dictionary contains a listing of calculated magnetic resonance signals in response to execution of the pulse sequence commands for the set of predetermined substances and wherein the pulse sequence commands comprises multiple groups of different longitudinal magnetization preparations, the magnetic resonance fingerprinting being encoded by forming different groups or variants of different longitudinal magnetization preparations, wherein each of the multiple groups of longitudinal magnetization preparations is followed by a zero echo time read out block, and wherein each zero echo time read out block acquires a portion of the magnetic resonance data.

14. A method of operating a magnetic resonance imaging system, wherein the magnetic resonance imaging system is configured for acquiring a magnetic resonance data from a subject within an imaging zone, wherein the method comprises:

acquiring the magnetic resonance data by controlling the magnetic resonance imaging system with pulse sequence commands, wherein the pulse sequence commands cause the magnetic resonance imaging system to acquire the magnetic resonance data according to a magnetic resonance fingerprinting technique, or MR parameter mapping-sequence wherein the pulse sequence commands are further configured to control the magnetic resonance imaging system to perform spatial encoding using a zero echo time magnetic resonance imaging protocol; and calculating a spatial distribution of each of a set of predetermined substances by comparing the magnetic resonance data with a magnetic resonance fingerprinting dictionary, wherein the magnetic resonance fingerprinting dictionary contains a listing of calculated magnetic resonance signals in response to execution of the pulse sequence commands for the set of predetermined substances and wherein the pulse sequence commands comprises multiple groups of different longitudinal magnetization preparations, the magnetic resonance fingerprinting being encoded by forming different groups or variants of different longitudinal magnetization preparations, wherein each of the multiple groups of longitudinal magnetization preparations is followed by a zero echo time read out block, and wherein each zero echo time read out block acquires a portion of the magnetic resonance data.

\* \* \* \* \*